United States Patent
Schuetz et al.

(10) Patent No.: US 8,732,941 B2
(45) Date of Patent: May 27, 2014

(54) ASSEMBLY AID FOR PRINTED BOARD CONNECTORS

(75) Inventors: Christian Schuetz, Hille (DE); Guenter Pape, Enger (DE)

(73) Assignee: Harting Electronics GmbH (DE)

( * ) Notice: Subject to any disclaimer, the term of this patent is extended or adjusted under 35 U.S.C. 154(b) by 691 days.

(21) Appl. No.: 12/716,965

(22) Filed: Mar. 3, 2010

(65) Prior Publication Data

US 2010/0229379 A1  Sep. 16, 2010

(30) Foreign Application Priority Data

Mar. 14, 2009 (DE) .......................... 20 2009 003 648

(51) Int. Cl.
    *B23F 19/00* (2006.01)
(52) U.S. Cl.
    USPC .................. 29/739; 29/729; 29/747; 439/135
(58) Field of Classification Search
    CPC .. H01R 43/205; H01R 43/28; H01R 13/5213; H05K 3/00
    USPC .................. 29/729, 739, 884–876, 759–760; 439/71–74, 570, 135, 149, 940; 269/903
    See application file for complete search history.

(56) References Cited

U.S. PATENT DOCUMENTS

| | | | |
|---|---|---|---|
| 3,680,193 A * | 8/1972 | Scaminaci et al. | 29/271 |
| 5,067,648 A * | 11/1991 | Cascini | 228/47.1 |
| 5,344,334 A * | 9/1994 | Laub et al. | 439/331 |
| 5,558,540 A * | 9/1996 | Kato et al. | 439/637 |
| 5,884,393 A * | 3/1999 | Miyazawa | 29/739 |
| 5,927,504 A | 7/1999 | Han et al. | 206/706 |
| 6,015,305 A | 1/2000 | McHugh et al. | 439/135 |
| 6,062,799 A * | 5/2000 | Han et al. | 414/416.07 |
| 6,726,500 B1 * | 4/2004 | McHugh et al. | 439/331 |
| 6,780,039 B2 * | 8/2004 | Wang | 439/342 |
| 6,799,714 B2 * | 10/2004 | Gleason | 228/212 |
| 6,927,339 B2 | 8/2005 | Murr et al. | 174/66 |
| 7,209,359 B2 * | 4/2007 | Matthews | 361/752 |
| 7,213,328 B2 * | 5/2007 | Maruyama | 29/760 |
| 7,445,466 B1 * | 11/2008 | Peng | 439/74 |
| 7,578,046 B2 * | 8/2009 | Vigil et al. | 29/564 |
| 7,591,669 B1 * | 9/2009 | Peng | 439/489 |
| 7,621,751 B2 * | 11/2009 | Minich | 439/41 |
| 7,921,552 B2 * | 4/2011 | Vigil et al. | 29/832 |
| 8,529,275 B2 * | 9/2013 | Kagotani | 439/41 |
| 2008/0102651 A1 * | 5/2008 | Szu et al. | 439/41 |
| 2008/0153330 A1 * | 6/2008 | Minich | 439/135 |

FOREIGN PATENT DOCUMENTS

| | | | |
|---|---|---|---|
| CN | 201271793 | 7/2009 | .......... B23K 37/053 |
| JP | 2000-036339 | 2/2000 | |

OTHER PUBLICATIONS

European Search Report issued in EP Application No. 10 400 015.3 dated Aug. 17, 2010, 6 pgs. Database WPI Week 200950, 1 pg.
German Search Report, dated Jan. 11, 2011 (4 pages).

* cited by examiner

*Primary Examiner* — Minh Trinh
(74) *Attorney, Agent, or Firm* — Hayes Soloway P.C.

(57) ABSTRACT

In order to simplify the assembly of printed board connectors, there is provided an assembly aid that features one or more recesses in accordance with the dimensions of the printed board connectors, wherein one or more printed board connectors to be assembled on a printed board can be inserted into said recesses. The contact spacing on the printed board corresponds with the arrangement of the printed board connectors in the assembly aid such that an exact alignment of the printed board connectors is realized. The assembly aid remains on the printed board until the soldering process is completed, wherein this prevents, for example, flotation of SMD components.

18 Claims, 7 Drawing Sheets

ASSEMBLY AID FOR PRINTED BOARD CONNECTORS

BACKGROUND OF THE INVENTION

1. Field of the Invention

The invention pertains to an assembly aid for printed board connectors that serves for accommodating and successively arranging at least one printed board connector to be positioned on a printed board.

An assembly aid of this type is required for jointly positioning several printed board connectors that may also have different dimensions on a printed board, wherein the assembly aid can be removed again after the soldering process.

2. Description of the Related Art

Such assembly aids are generally known, but have the disadvantage that they cannot be removed in some cases or are only designed for special arrangements on a printed board and therefore frequently structured in a quite complicated fashion.

U.S. Pat. No. 5,558,540 discloses a multicontact arrangement, in which two printed board connectors that are spaced apart from one another are arranged in a common frame, wherein a removable holding part is arranged between the two connectors for the assembly of the arrangement.

SUMMARY OF THE INVENTION

The invention therefore is based on the objective of realizing an assembly aid for jointly assembling several printed board connectors on a printed board, wherein said assembly aid has a simple design and can be cost-efficiently manufactured.

This objective is attained in that the assembly aid features a peripheral rectangular assembly frame, in which intersecting support arms are integrally formed onto at least two opposing sides of the assembly frame, and in that devices for at least temporarily holding the printed board connectors are provided in two other opposing sides of the assembly frame.

The advantages attained with the invention can be seen, in particular, in that several printed board connectors can be simultaneously positioned on a printed board in a single operation.

In this case, the assembly aid initially remains on the printed board in order to fix the printed board connectors and is not removed until the soldering process is completed such that possible flotation of the printed board connectors—particularly of SMD components—is strictly prevented.

In addition, this type of assembly makes it possible to minimize positional tolerances because at least the simultaneously positioned printed board connectors have an exact alignment on the printed board and therefore an equally exact alignment relative to the mating connectors. It simultaneously prevents mechanical stresses between the connectors that could possibly result in shearing loads and cracks at the soldering points that, in turn, could lead to malfunctions of the electronics.

The control of soldered connections between the contact and the printed board represents a significant secondary aspect in the surface-soldering technology.

Printed board connectors with a two-row design have the significant advantage that the soldering points of these contacts on the printed boards can be visually checked to both sides of the connector body while printed board connectors with more than two rows frequently need to be tested with a much more cost-intensive X-ray analysis in order to reliably detect soldering flaws on individual contacts.

When using two-row printed board connectors, it is necessary to install a larger quantity in order to contact a similar number of contacts on the printed board. The utilization of the inventive assembly aid is very advantageous for simplifying the assembly and for shortening the assembly time.

The frame of such an assembly aid is preferably designed for accommodating several printed board connectors, wherein a rectangular frame is provided with holding devices, into which the printed board connectors are inserted and can be clipped, on the opposing narrow sides.

Support arms are integrally formed onto the frame in a crosswise fashion above the mating face of the clipped-in printed board connectors, wherein said support arms preferably have an enlarged intersecting point, on which an automated assembly device can engage in order to place the assembly aid on the printed board.

However, it is also possible to realize any other construction of the support arms, e.g., in the form of an H.

A holding device based on the tongue and groove principle is provided for temporarily holding the printed board connectors in the assembly frame.

Furthermore, the mating side of the printed board connectors can be advantageously protected against dirt accumulation with a protective device in the form of a cover.

BRIEF DESCRIPTION OF THE DRAWINGS

One embodiment of the invention is illustrated in the figures and described in greater detail below in which.

DESCRIPTION OF THE PREFERRED EMBODIMENTS

Figure 1:
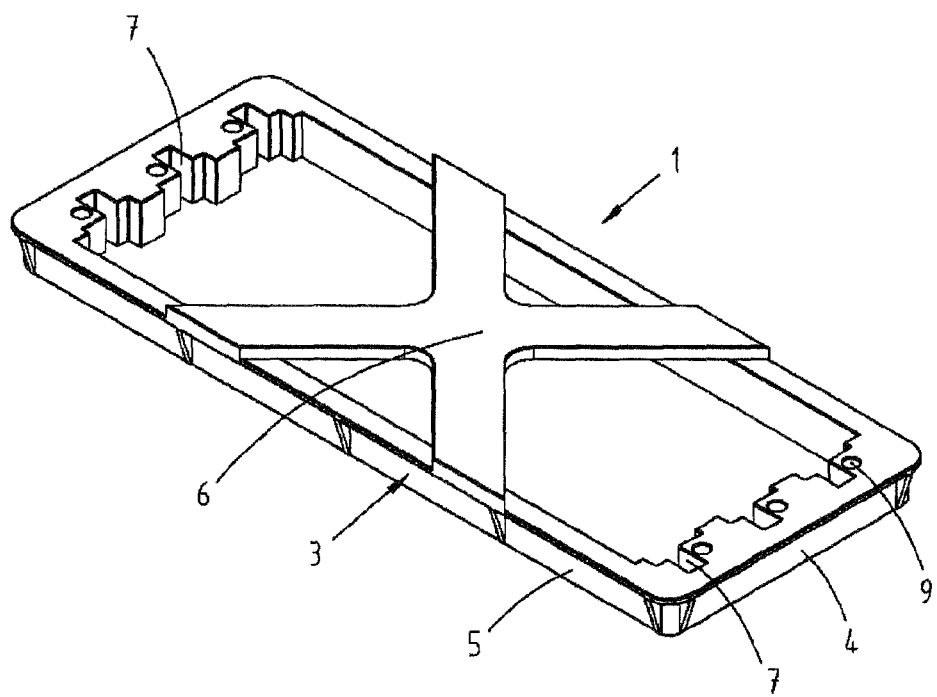
FIG. 1 shows an assembly frame for three printed board connectors.

FIG. 1 shows an assembly aid 1 with an assembly frame 3 for accommodating several printed board connectors.

The assembly frame 3 is composed of four frame braces, namely two shorter braces 4 and two longer braces 5, wherein intersecting support arms 6 are integrally formed onto two of the oppositely arranged longer braces 5. The shorter braces 4 are provided with opposing recesses 7, into which printed board connectors 15 to be positioned on a printed board are respectively inserted.

Bores 9 are furthermore arranged in the shorter braces 4, wherein guide pins 8 integrally formed onto the printed board connectors 15 can be inserted into said bores.

Figure 2:
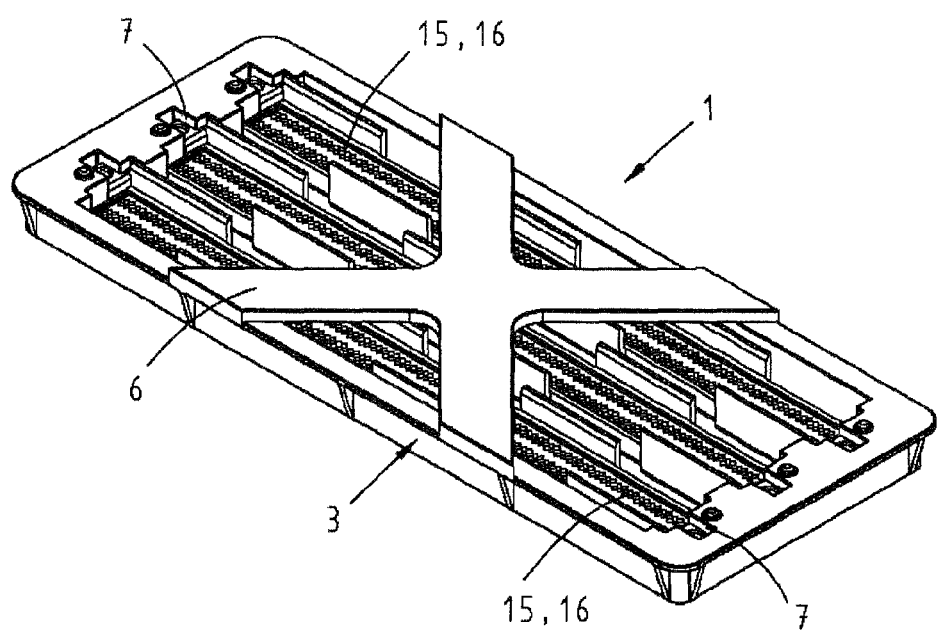
FIG. 2 shows an assembly frame fitted with three printed board connectors.

FIG. 2 shows a correspondingly fitted assembly frame 3 with three printed board connectors 15.

In this case, the printed board connectors are inserted into the recesses 7 in the assembly frame 3 in such a way that their mating side 16 to be contacted with a corresponding mating connector points in the direction of the intersecting support arms 6.

For this purpose, the printed board connectors 15 are clipped into the recesses 7 and the assembly aid 1 is positioned on a printed board manually or with the aid of an automated device that is usually vacuum-actuated. In this case, tolerances between the printed board connectors are minimized with the assembly aid and the frame causes a uniform alignment of the printed board connectors on the printed board.

Figure 3:
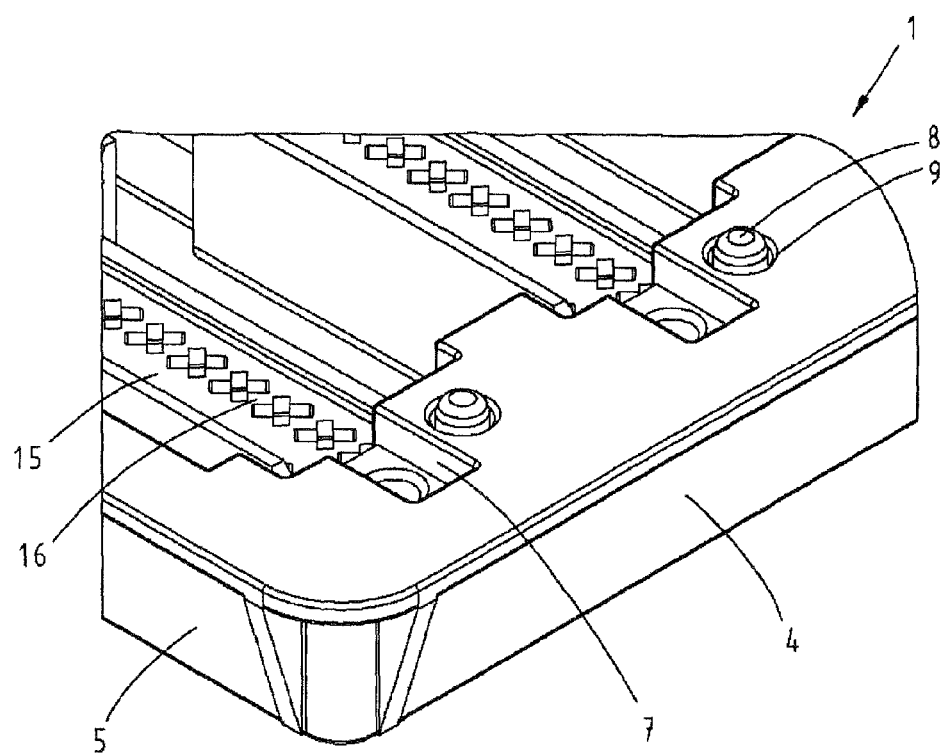
FIG. 3 shows a detail of the assembly frame with inserted printed board connectors.

FIG. 3 shows a view of the mating side 16 of the printed board connectors 15 in the assembly aid 1 in the form of an enlarged detail, wherein this figure shows the recesses 7, in which the printed board connectors 15 are held, as well as the guide pins 8 that are inserted into the bores 9.

Figure 4:
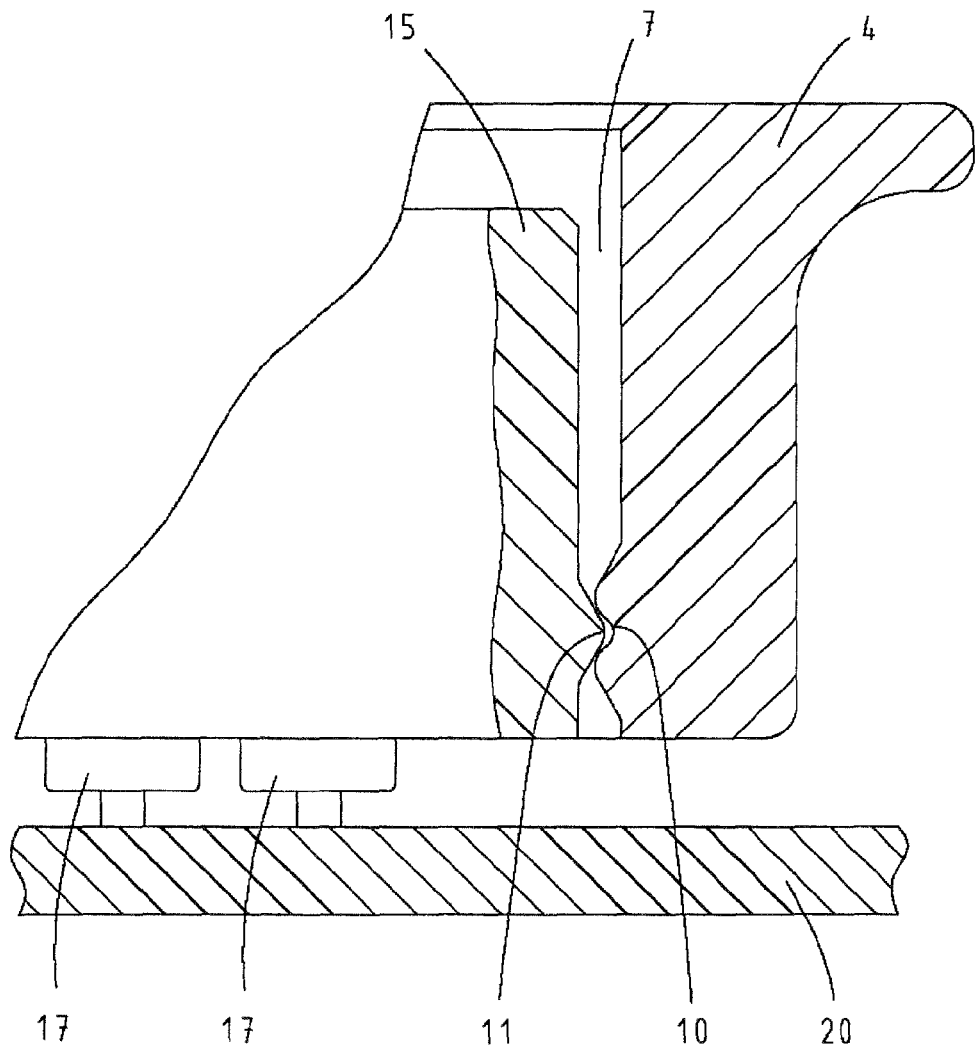
FIG. 4 shows a detail of a holding device between an assembly frame and a printed board connector

The holding device for clipping in the printed board connectors is illustrated in FIG. 4 in the form of a detailed sectional representation, wherein the end of the printed board connector 15 features a rounded clip 11 that engages into a significantly rounded groove 10 in the assembly frame 3—but allows a simple separation of the assembly aid from the connectors after the soldering of the printed board connectors.

Figure 5:
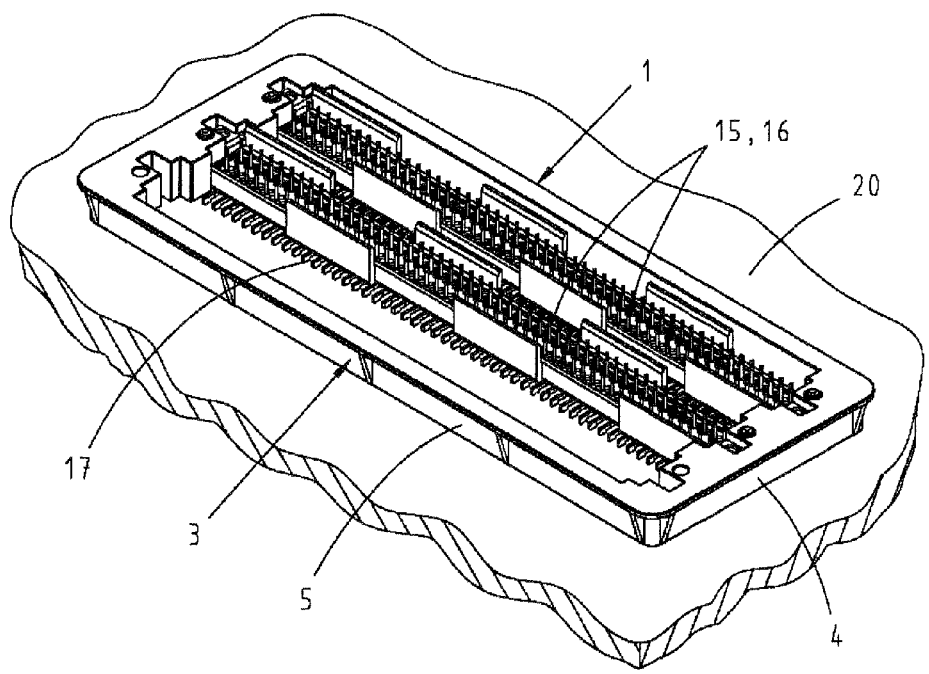
FIG. 5 shows an assembly aid with printed board connectors arranged therein after it was placed on a printed board.

FIG. 5 shows the assembly of two printed board connectors 15 in the assembly aid 1 on a printed board 20, wherein the mating side 16 of the printed board connectors is directed upward in this case and the SMD contacts 17 are directed toward the soldering side.

Figure 6:
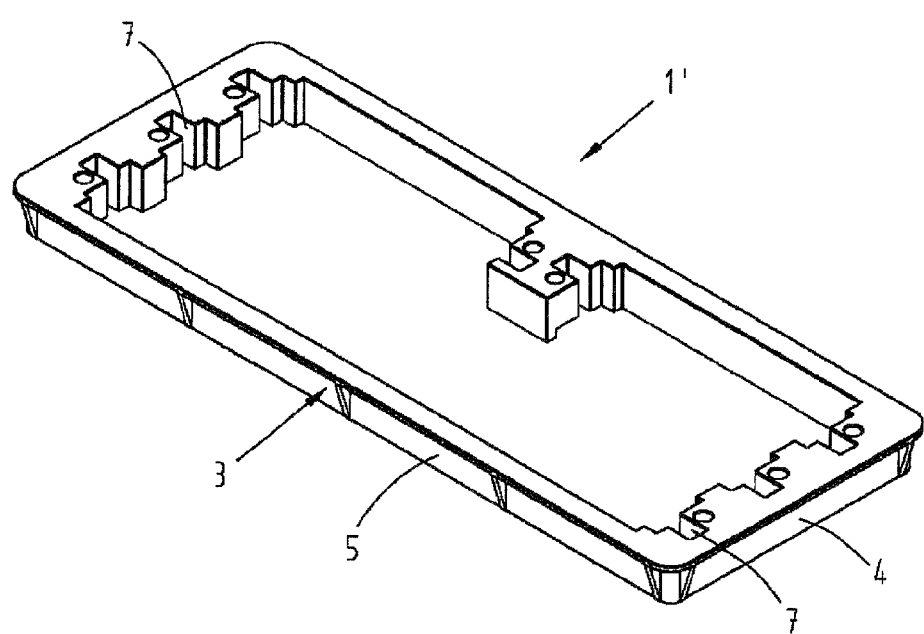
FIG. 6 shows a variation of an assembly frame for accommodating different printed board connectors.

A variation of the assembly aid 1' is provided for special applications, in which printed board connectors with different dimensions need to be placed on a printed board. Such a frame 3 is illustrated in FIG. 6.

Figure 7:
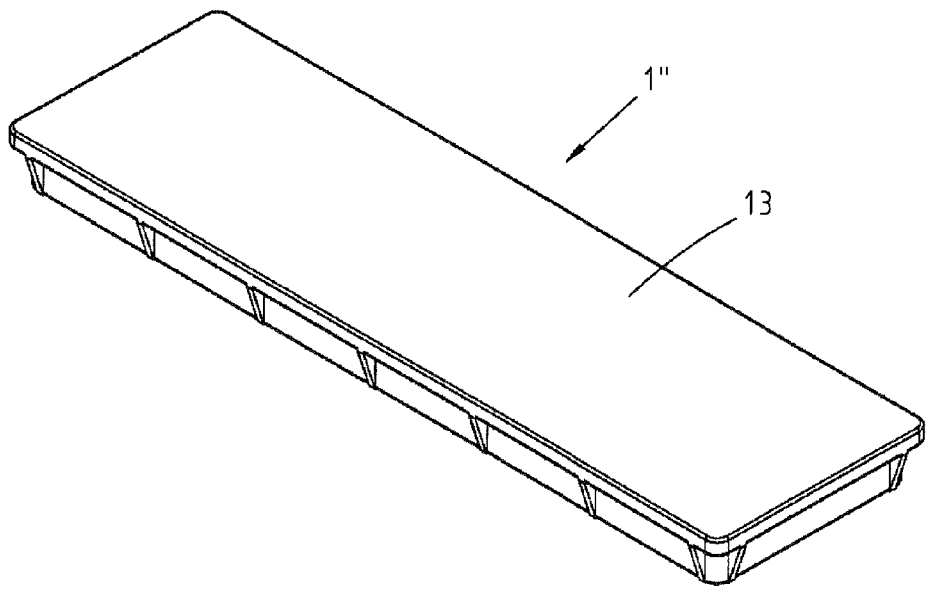
FIG. 7 shows another variation of an assembly frame with integrated protective cover.

In case a protective device is required for the transport or, for example, during the soldering process, the invention proposes another variation of an assembly aid 1", in which a cover 13 can be clipped onto the assembly frame or the cover is rigidly connected to the assembly frame as shown in FIG. 7.

What is claimed is:

1. An assembly aid for printed board connectors that serves for temporarily positioning at least one printed board connector on a printed board during a soldering process of the connector and the printed board, said assembly aid comprising a peripheral rectangular assembly frame having two long braces and two short braces on respective opposing sides of the frame, and further including intersecting support arms integrally formed onto at least two opposing sides of the frame, and wherein the rectangular assembly frame includes grooves provided in recesses in opposing sides of the short braces of the assembly frame for accommodating tongues integrally formed on distal ends of the printed board connectors for temporarily locking the printed board connectors during the soldering process, wherein the grooves are molded within the short braces of the assembly frame, and the tongues are integrally formed onto both ends of the printed board connectors.

2. The assembly aid according to claim 1, further including a removable clip-on cover on one side of the rectangular assembly frame.

3. The assembly aid according to claim 1, further including an integrated rigidly coupled protective cover on one side of the rectangular assembly frame.

4. The assembly aid according to claim 1, wherein the tongues are in a form of rounded clips.

5. An assembly aid and printed board connector combination, wherein the assembly aid serves for temporarily positioning the printed board connector on a printed board during a soldering process of the connector and the printed board, said assembly aid comprising a peripheral rectangular assembly frame having two long braces and two short braces on respective opposing sides of the frame, and further including intersecting support arms integrally formed onto at least two opposing sides of the frame, and wherein the rectangular assembly frame includes grooves provided in recesses in opposing sides of the short braces of the assembly frame for accommodating tongues integrally formed on distal ends of the printed board connectors for temporarily locking the printed board connectors during the soldering process, wherein the grooves are molded within the short braces of the assembly frame and the tongues are integrally formed onto both ends of the printed board connectors.

6. The assembly aid and printed circuit board connector combination according to claim 5, comprising two or more printed board connectors having different dimensions.

7. The assembly aid and printed circuit board connector combination according to claim 5, further including a removable clip-on cover on one side of the rectangular assembly frame.

8. The assembly aid and printed circuit board connector combination according to claim 5, further including an integrated rigidly coupled protective cover on one side of the rectangular assembly frame.

9. The assembly aid and printed circuit board connector combination according to claim 5, wherein the tongues are in a form of rounded clips.

10. An assembly aid for printed board connectors that serves for temporarily positioning at least one printed board connector on a printed board during a soldering process of the connector and the printed board, said assembly aid comprising a peripheral rectangular assembly open frame having two long braces and two short braces on respective opposing sides of the frame, further including intersecting support arms integrally formed onto at least two opposing sides of the frame, and wherein the rectangular assembly frame includes holding means for temporarily holding the printed board connectors provided in recesses in opposing sides of the short braces of the assembly frame, said assembly aid further including a removable protective cover on one side of the rectangular assembly frame.

11. The assembly aid according to claim 10, wherein the holding means for temporarily holding the printed board connectors in the recesses in the opposing sides of the short braces are shaped to accommodate the printed board connectors.

12. The assembly aid according to claim 10, wherein the protective cover comprises a removable clip-on cover.

13. The assembly aid according to claim 10, wherein the protective cover comprises an integrated rigidly coupled protective cover.

14. An assembly aid and printed board connector combination, wherein the assembly aid serves for temporarily positioning the printed board connector on a printed board during a soldering process of the connector and the printed board, said assembly aid comprising a peripheral rectangular assembly open frame having two long braces and two short braces on respective opposing sides of the frame, and further including intersecting support arms integrally formed onto at least two opposing sides of the frame, wherein the rectangular assembly frame includes holding means for temporarily holding the printed board connectors provided in recesses in opposing sides of the short braces of the assembly frame, said assembly aid and printed board connector combination further including a removable protective cover on one side of the rectangular assembly frame.

15. The assembly aid and printed circuit board connector combination according to claim 14, wherein the holding means for temporarily holding the printed board connectors in the recesses in the opposing sides of the short braces are shaped to accommodate the printed board connectors.

16. The assembly aid and printed circuit board connector combination according to claim 14, comprising two or more printed board connectors having different dimensions.

17. The assembly aid and printed circuit board connector combination according to claim 14, wherein the protective cover comprises a removable clip-on cover.

18. The assembly aid and printed circuit board connector combination according to claim 14, wherein the protective cover comprises an integrated rigidly coupled protective cover.

\* \* \* \* \*